(12) United States Patent
Leidel et al.

(10) Patent No.: US 10,838,865 B2
(45) Date of Patent: Nov. 17, 2020

(54) STACKED MEMORY DEVICE SYSTEM INTERCONNECT DIRECTORY-BASED CACHE COHERENCE METHODOLOGY

(71) Applicant: Micron Technology, Inc., Boise, ID (US)

(72) Inventors: John Leidel, McKinney, TX (US); Richard C Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 14/706,516

(22) Filed: May 7, 2015

(65) Prior Publication Data
US 2015/0324290 A1 Nov. 12, 2015

Related U.S. Application Data

(60) Provisional application No. 61/990,207, filed on May 8, 2014.

(51) Int. Cl.
*G06F 12/0817* (2016.01)
*G06F 13/40* (2006.01)
(Continued)

(52) U.S. Cl.
CPC ...... *G06F 12/0817* (2013.01); *G06F 12/0828* (2013.01); *G06F 13/16* (2013.01);
(Continued)

(58) Field of Classification Search
CPC ... G06F 12/08; G06F 12/0844; G06F 12/0828
See application file for complete search history.

(56) References Cited

U.S. PATENT DOCUMENTS

2004/0030841 A1  2/2004 Nanda et al.
2004/0034747 A1* 2/2004 Rowlands ........... G06F 12/0824
                                                       711/148
(Continued)

FOREIGN PATENT DOCUMENTS

CN    106462501 A    2/2017
CN    106462501      7/2019
(Continued)

OTHER PUBLICATIONS

Gwangsun Kim Kaist, John Kim Kaist, Jung Ho Ahn, Jaeha Kim, Memory-centric system interconnect design with hybrid memory cubes, Oct. 7, 2013, 145-155.*

(Continued)

*Primary Examiner* — Larry T Mackall
*Assistant Examiner* — Michelle T Bechtold
(74) *Attorney, Agent, or Firm* — Schwegman Lundberg & Woessner, P.A.

(57) ABSTRACT

A system includes a plurality of host processors and a plurality of hybrid memory cube (HMC) devices configured as a distributed shared memory for the host processors. An HMC device includes a plurality of integrated circuit memory die including at least a first memory die arranged on top of a second memory die, and at least a portion of the memory of the memory die is mapped to include at least a portion of a memory coherence directory; and a logic base die including at least one memory controller configured to manage three-dimensional (3D) access to memory of the plurality of memory die by at least one second device, and logic circuitry configured to implement a memory coherence protocol for data stored in the memory of the plurality of memory die.

27 Claims, 6 Drawing Sheets

FOUR-LINK, SIMPLE TOPOLOGY

FOUR-LINK, MESH TOPOLOGY

FOUR-LINK, RING TOPOLOGY

FOUR-LINK, 2D TORUS TOPOLOGY (51) Int. Cl.
  *G06F 13/16*  (2006.01)
  *G11C 8/12*  (2006.01)
  *G11C 5/02*  (2006.01)
  *H01L 25/10*  (2006.01)
(52) U.S. Cl.
  CPC .......... *G06F 13/1663* (2013.01); *G06F 13/40* (2013.01); *G06F 13/4022* (2013.01); *G11C 5/025* (2013.01); *G11C 8/12* (2013.01); *H01L 25/105* (2013.01); *G06F 2212/622* (2013.01); *H01L 2924/0002* (2013.01)

(56) References Cited

U.S. PATENT DOCUMENTS

| | | | |
|---|---|---|---|
| 2004/0088495 | A1 | 5/2004 | Glasco et al. |
| 2005/0198441 | A1 | 9/2005 | Tokoro |
| 2006/0129709 | A1* | 6/2006 | Bandholz .................. G06F 9/52 710/30 |
| 2007/0174557 | A1 | 7/2007 | Watanabe |
| 2009/0147557 | A1* | 6/2009 | Lahtinen .................. G11C 5/02 365/51 |
| 2010/0165692 | A1 | 7/2010 | Jeddeloh |
| 2012/0106228 | A1 | 5/2012 | Lee |
| 2013/0073811 | A1 | 3/2013 | Beckmann et al. |
| 2013/0119528 | A1 | 5/2013 | Groothuis et al. |
| 2013/0138892 | A1* | 5/2013 | Loh ..................... G06F 12/0864 711/134 |
| 2013/0347110 | A1 | 12/2013 | Dalal |
| 2014/0181417 | A1* | 6/2014 | Loh ..................... G06F 12/0828 711/141 |
| 2014/0279846 | A1* | 9/2014 | Srinivasan ........ G06F 17/30011 707/608 |
| 2015/0378913 | A1* | 12/2015 | Jouppi .................... G06F 12/08 711/119 |
| 2016/0092362 | A1* | 3/2016 | Barron ................ G06F 12/0835 710/308 |

FOREIGN PATENT DOCUMENTS

| | | |
|---|---|---|
| JP | 2005234854 A | 9/2005 |
| JP | 2007199999 A | 8/2007 |
| JP | 2008046701 A | 2/2008 |
| JP | 2009116398 A | 5/2009 |
| JP | 2012514286 A | 6/2012 |
| TW | 201612755 A | 4/2016 |
| WO | WO-2012077169 A1 | 6/2012 |
| WO | WO-2014178854 A1 | 11/2014 |
| WO | WO-2015171914 A1 | 11/2015 |

OTHER PUBLICATIONS

"European Application Serial No. 15789174.8, Response filed Jul. 3, 2017 to Communication Pursuant to Rules 161(2) and 162 EPC dated Dec. 23, 2016", 40 pgs.
"Hybrid Memory Cube Specification 1.0", Hybrid Memory Cube Consortium, [Online]. Retrieved from the Internet: <URL: http://www.hybridmemorycube.org/files/SiteDownloads/HMC_Specification%201_0.pdf>, (Jan. 2013), 122 pages.
"International Application Serial No. PCT/US2015/029718, International Preliminary Report on Patentability dated Nov. 17, 2016", 10 pgs.
"International Application Serial No. PCT/US2015/029718, International Search Report dated Aug. 6, 2015", 3 pgs.
"International Application Serial No. PCT/US2015/029718, Written Opinion dated Aug. 6, 2015", 8 pgs.
Leidel, John D., et al., "HMC-Sim: A Simulation Framework for Hybrid Memory Cube Devices", [Online]. Retrieved from the Internet: <URL: http://discl.cs.ttu.edu/lib/exe/fetch.php?media=wiki:papers:lspp14_jleidel_camera_ready_ieee.pdf>, (Accessed May 8, 2014), 10 pgs.
"European Application Serial No. 15789174.8, Extended European Search Report dated Dec. 12, 2017", 7 pgs.
"Japanese Application Serial No. 2016-566636, Office Action dated Dec. 5, 2017", With English Translation, 11 pgs.
"Japanese Application Serial No. 2016-566636, Response filed Mar. 5, 2018 to Office Action dated Dec. 5, 2017", w/English Claims, 16 pgs.
"Korean Application Serial No. 10-2016-7034318, Notice of Preliminary Rejection dated Mar. 21, 2018", w/ English Translation, 5pgs.
"Chinese Application Serial No. 201580031855.3, Office Action dated Nov. 27, 2018", W/ English Translation, 25 pgs.
"Japanese Application Serial No. 2016-566636, OfficeAction dated Sep. 4, 2018", W/English Translation, 10 pgs.
"Japanese Application Serial No. 2016-566636, Response filed Nov. 26, 2018 to Office Action dated Sep. 4, 2018", w/ English Claims, 22 pgs.
"Korean Application Serial No. 10-2016-7034318, Notice of Preliminary Rejection dated Sep. 28, 2018", w/ English translation, 9 pgs.
"Korean Application Serial No. 10-2016-7034318, Response filed Nov. 21, 2018 to Notice of Preliminary Rejection dated Sep. 28, 2018", w/ English Claims, 30 pgs.
"Taiwanese Application Serial No. 104114782, Office Action dated Oct. 9, 2018", w/ English translation, 20 pgs.
"Taiwanese Application Serial No. 104114782, Response filed Jan. 4, 2019 to Office Action dated Oct. 9, 2018", w/ English Claims, 26 pgs.
Gwangsun, Kim, et al., "Memory-centric system interconnectdesign with hybrid memory cubes", Proceedings of the 22nd International Conference on Parallel Architectures and Compilation Techniques, (Oct. 7, 2013), 145-156.
"Korean Application Serial No. 10-2016-7034318, Final Office Action dated Mar. 29, 2019", W English Translation, 7 pgs.
"Chinese Application Serial No. 201580031855.3, Response filed Apr. 9, 2019 to Office Action dated Nov. 27, 2018", w English Claims, 26 pgs.
"Taiwanese Application Serial No. 104114782, Office Action dated Mar. 25, 2019", w English translation, 10 pgs.
"Korean Application Serial No. 10-2016-7034318, Response filed Apr. 17, 2019 to Final Office Action dated Mar. 29, 2019", w English Claims, 20 pgs.
"Korean Application Serial No. 10-2016-7034318, Notice of Preliminary Rejection dated May 20, 2019", w English Translation, 6 pgs.
"Taiwanese Application Serial No. 104114782, Response filed May 27, 2019 to Office Action dated Mar. 25, 2019", w no English claims, 6 pgs.
"Japanese Application Serial No. 2016-566636, Examiners Decision of Final Refusal dated May 14, 2019", w English Translation, 8 pgs.
"Korean Application Serial No. 10-2016-7034318, Response filed Jul. 18, 2019 to Notice of Preliminary Rejection dated May 20, 2019", w English Claims, 28 pgs.
"European Application Serial No. 15789174.8, Communication Pursuant to Article 94(3) EPC dated Mar. 4, 2020", 5 pgs.

* cited by examiner

| UNUSED [63:46] | DIRECTORY BITS [45:42] | CUB [41:34] | BASE PHYSICAL ADDRESS [33:0] |

STACKED MEMORY DEVICE SYSTEM INTERCONNECT DIRECTORY-BASED CACHE COHERENCE METHODOLOGY

RELATED APPLICATIONS

This U.S. Patent Application claims the priority benefit of U.S. Provisional Application Ser. No. 61/990,207, filed May 8, 2014, the contents of which are incorporated be reference in its entirety.

BACKGROUND

Multi-processor systems can include shared memory that allows more than one processor to perform operations on the same data. Access to shared memory can be slow and can lead to system latency. To improve memory access time, multi-processor shared memory systems can include a relatively smaller but faster access cache memory. Cache memory stores a copy of data that may be frequently accessed by the processors. To maintain correctness of cached data, a cache coherence protocol is followed. A cache coherence protocol imposes rules on access to cached data by processors to ensure that data is correct across all of the processors despite the existence of multiple copies of the data. However, cache coherence protocols can consume precious system bandwidth and produce uneven latency for data access. The present inventors have recognized a need for improved data management in multi-processor shared memory systems.

DETAILED DESCRIPTION

In the following detailed description of example embodiments of the invention, reference is made to specific example embodiments of the invention by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit other embodiments of the invention or the invention as a whole, and any reference to the invention, its elements, operation, and application do not limit the invention as a whole but serve only to define these example embodiments. The following detailed description does not, therefore, limit the scope of the various embodiments of the invention, which is defined only by the appended claims.

In conventional computer systems, memory is organized two-dimensionally into rows and columns Efforts to improve memory access latency have included development of double data rate type three (DDR3) or DDR4 with a high bandwidth interface. DDR3 and DDR4 use the traditional row/column approach.

Figure 1:
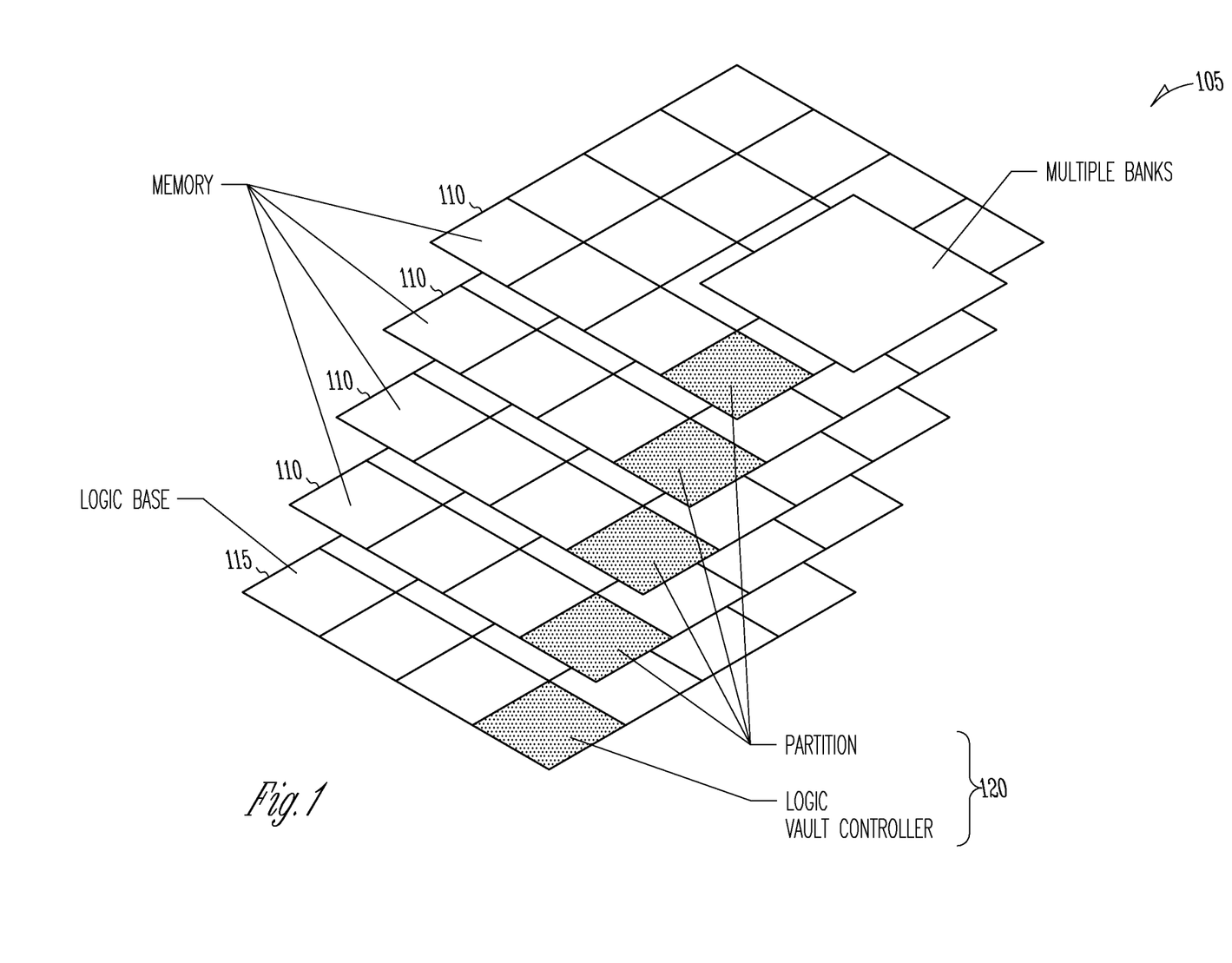
FIG. 1 illustrates a representation of a Hybrid Memory Cube, as may be used to practice some embodiments of the invention.

FIG. 1 illustrates a representation of a Hybrid Memory Cube 105 (HMC). An HMC includes a third dimension by stacking integrated circuit (IC) memory die 110 and interconnecting the die using through silicon via (TSV) structures (not shown) that enable access on both the top and bottom of IC die. TSV manufacturing techniques enable interconnection of multiple die layers in order to construct three-dimensional dies. This ability of interconnecting multiple die layers permits building a memory device with a combination of memory storage layers and one or more logic layers. In this manner, the device provides the physical memory storage and logical memory transaction processing in a single package. The arrangement shown in FIG. 1 is to illustrate a concept and does not necessarily represent an actual die layout.

An HMC (e.g., as specified in the Hybrid Memory Cube Specification version 1.0) can provide a very compact and power efficient package with available bandwidth capacity of up to 320 GB/s per device. The HMC device is capable of such bandwidth via a hierarchical and parallel approach to the design. The device hierarchy occurs vertically across the logic layers and the hardware parallelism occurs across a given die layer. Within an HMC, memory is organized into vaults. Each vault 120 vertically spans each of the memory layers within the die using the through-silicon vias. In the simplified example of FIG. 1, the HMC is organized into 16 vaults with each vault having a logic base die layer 115 or logic base.

Figure 2:
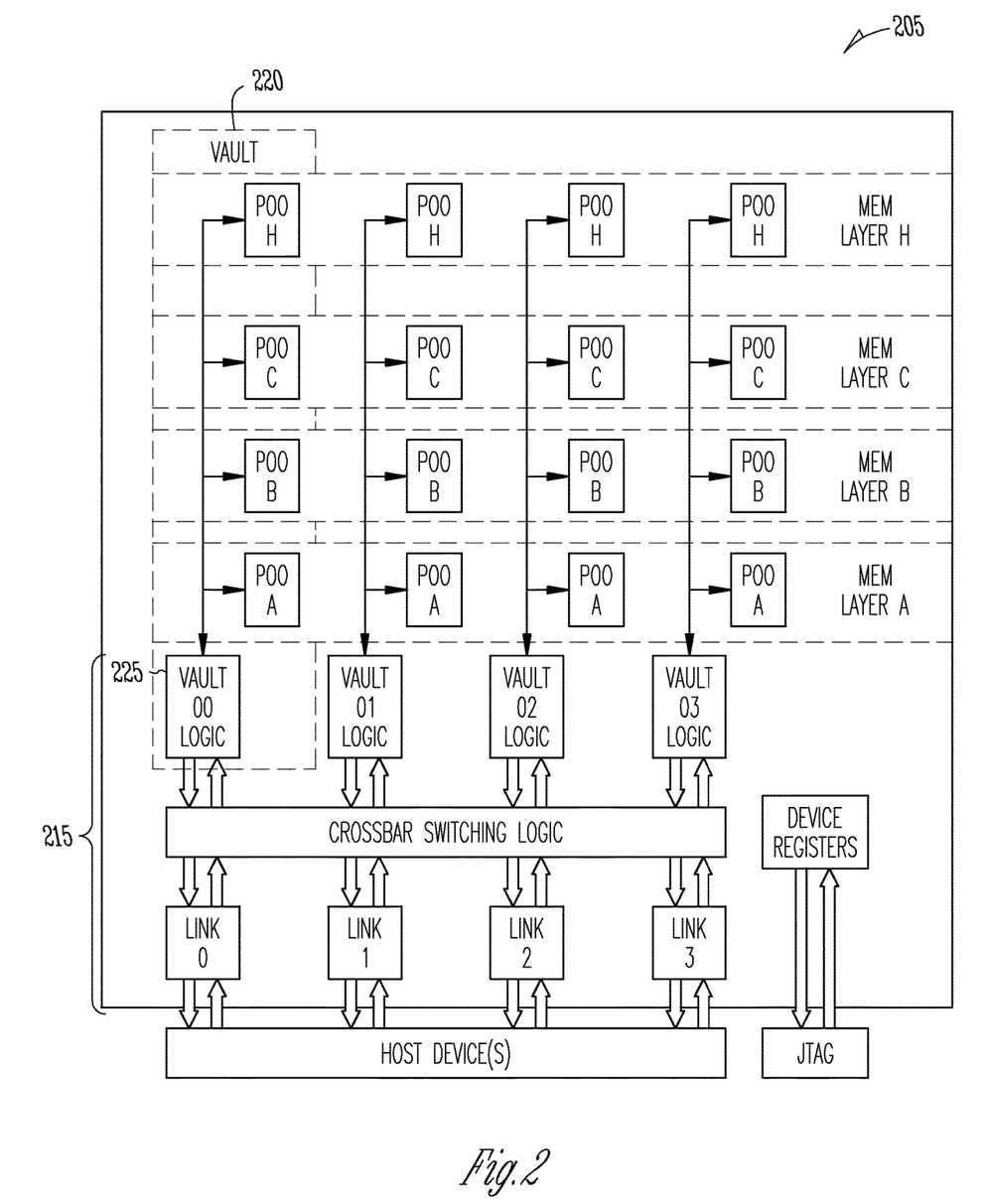
FIG. 2 is a block diagram illustrating a quadrant of a Hybrid Memory Cube, as may be used to practice some embodiments of the invention.

FIG. 2 is a block diagram illustrating a quadrant of an HMC 205. Four vaults of the HMC are shown with each vault 220 including multiple memory layers. The logic base layer 215 includes multiple components. For instance, each vault has a memory controller in the logic base that manages all memory reference operations for the vault. The memory controllers provide flexible access to the 3D storage layers. The 3D layered approach permits memory transactions to exist in parallel not only across banks within a target storage array, but also across parallel storage arrays. The logic base layer 215 may include one or more processors to implement the functions described, and an HMC can be a processor in memory (PIM) device.

The logic base layer 215 provides both external link access to the HMC device as well as internal routing and transaction logic. The external I/O links are provided by four or eight logical links. Each link can include a group of sixteen or eight serial I/O, or SERDES, bidirectional links. Four link devices have the ability to operate at 10, 12.5 and 15 Gbps. Eight link devices have the ability to operate at 10 Gbps. Internally, the links are attached to routing logic in order to direct transactions at logic devices that control each vertical memory storage unit. In the example of FIG. 2, the routing logic includes the cross bar switching logic.

The HMC link structure supports the ability to attach devices to both hosts (processors) or other HMC devices.

This concept of chaining permits the construction of memory subsystems that require capacities larger than a single device while not perturbing the link structure and packetized transaction protocols. Links can be configured as host device links or pass-through links in a multitude of topologies.

Figure 3:
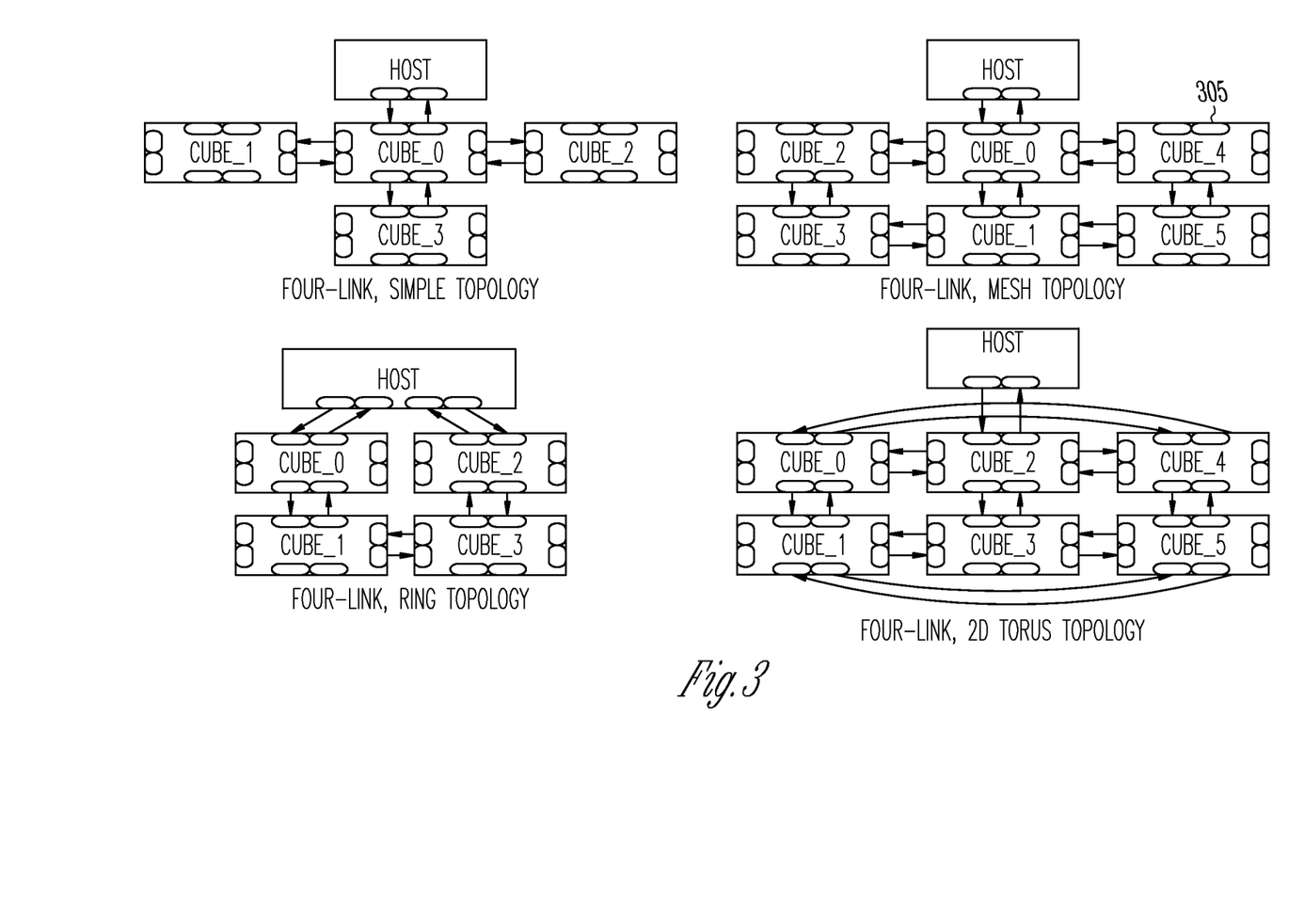
FIG. 3 shows block diagrams of four potential device topologies for Hybrid Memory Cubes, as may be used to practice some embodiments of the invention.

FIG. 3 shows block diagrams of four potential device topologies based upon the base four-link HMC configuration. The HMC memory devices 305 can be configured in a traditional network topology such as a mesh, torus or crossbar. Chaining the multiple HMC devices together increases the total memory capacity available to a host.

Returning to FIG. 2, the logic base layer for a vault is analogous to a DIMM controller unit for each independent vault. In the Example of FIG. 2, the vault logic blocks 225 and their respective vault storage units 220 can be organized into quad units. Each quad unit represents four vault units. Each quad unit is loosely associated with the closest physical link block. In this manner, host devices have the ability to minimize the latency through the logic base layer of an HMC device by logically sending request packets to links whose associated quad unit is physically closest to the required vault.

Once within a target memory vault, memory storage can be broken into the traditional concept of banks and dynamic random access memories (DRAMs). Vertical access through the stacked memory layers is analogous to choosing the appropriate memory bank. Lower banks can be configured in lower die layers while vertical ascension selects subsequent banks. Once within a bank layer, the DRAM can be organized traditionally using rows and columns. The vault controller breaks the DRAM into one megabit (1 Mb) blocks each addressing 16-bytes. Read or write requests to a target bank can be performed in 32-bytes for each column fetch.

For a multi-host multi-HMC system, in-band communication between host devices and HMC devices is performed using a packetized format. This packetized format can include three major packet classifications: request packets, response packets, and flow control packets. Packets can be configured as a multiple of a single 16-byte flow unit, or FLIT. The maximum packet size contains 9 FLITs, or 144 bytes. The minimum 16-byte (one FLIT) packet contains a packet header and packet tail. Memory read request packets for all memory payload sizes may only require the packet header, tail and the respective physical memory address. Therefore, read requests can be configured using a single FLIT. Write requests and atomic request packets, however, also contain the required input data for write and read-modify-write operations, respectively. Therefore, these request types have packet widths of 2-9 FLITs.

An HMC system implementation may have multiple packet reordering points. Arriving packets that are destined for ancillary devices may pass those waiting for local vault access. Local vaults may also reorder queued packets in order to make the most efficient use of bandwidth to and from the respective vault banks. However, reordering points present in a given HMC implementation maintain the order of a stream of packets from a specific link to a specific bank within a vault. This ensures that memory write requests followed by memory read requests deliver correct and deterministic memory behavior.

As explained previously, an HMC provides a high bandwidth device. However, present system interconnect specifications typically lack sufficient functionality, flexibility and performance necessary to maintain appropriate balance in systems whose main memory is based on high bandwidth devices such as an HMC. For instance, a system architecture may include one or more HMCs to maintain a hundreds of gigabyte per second bandwidth between a system on chip (SoC) and local memory, but the system architecture may provide system interconnect having only a fraction (e.g., one tenth) of this available bandwidth. The result can be a highly imbalanced system.

Further, if the processors attached to the system interconnect provide cache coherence mechanisms, separate logic blocks may have to be added to the system to provide sufficient bandwidth and functionality to maintain concurrency and correctness in both the shared memory and cache memory subsystems. This results in processor interconnect, memory interconnect, and system interconnect with a complex set of peripheral logic blocks and complex protocol specifications having different degrees of latency.

Inefficient cache coherency is especially a concern in applications with multiple threads (or tasks) of execution distributed among multiple SoC devices or sockets. If the core SoC or processor supports functional data caching, the cache coherency mechanism between the SoC sockets must support a local memory bandwidth that can be an order of magnitude higher than the bandwidth available on the system interconnect. Again, the result is a highly imbalanced system.

An approach to improve system level latency is to provide a memory coherence subsystem having a bandwidth of substantially the high bandwidth memory devices. One way to provide this is to implement system memory coherence using one or more HMC devices. Because the HMC has the ability to execute in-situ atomic memory operations, the HMC can be extended to provide a high bandwidth and low latency memory coherency mechanism.

In a conventional system, one approach for cache coherence is to use a directory-based cache coherence protocol. The coherence directory acts as a filter through which a processor seeks permission to load an entry from the primary memory to its cache. When an entry is changed the directory either updates or invalidates the other caches with that entry. Directory-based cache coherence includes maintenance of a "directory" that assigns state to cache lines. Every cache line can be assigned a "home node" as the ultimate arbiter of the state of the cache line. The home node owns the address space and gives permission to modify the cache line. The directory assigns status and the directory-based protocol then uses point-to-point communication among the hosts to process metadata.

Processors typically store a significant amount of cache line state information of the directory and rely on fast cache memory access to read cache metadata and determine the state of the cache line. A cache memory controller keeps track of which host checked out the cache line. In this configuration, the cache directories themselves must be cached (often fully-associatively) creating complex and power-hungry data structures that are maintained at last level caches or memory controllers. These data structures often do not fit on-chip and have to be backed by DRAM for large Symmetric Multiprocessor (SMP) configurations.

Because of the hierarchical nature of its physical memory storage, an HMC device has a different physical addressing and interleave model than do traditional banked DRAM devices (e.g., DDR3 or DDR4 devices). Physical addresses for HMC devices are encoded into a 34-bit field that contain the vault, bank, and address bits. An implementation with four link devices utilizes the lower 32-bits of the field and an implementation with eight link devices utilizes the lower 33-bits of the field.

In contrast to DDR3 or DDR4 devices, an HMC device can inexpensively implement an abstracted memory storage interface. For instance for a DDR type device, when a processor desires to access an address, the real or actual physical address is placed on a bus and accessed. In an HMC protocol, the physical address can be re-mapped when it arrives at the HMC to a different memory address. Thus, for an HMC there's no guarantee of the actual memory location written. Additionally, the HMC is not required to generate a response at a set time.

This address re-mapping capability of an HMC can be leveraged to implement directory-based memory coherence. To provide support for directory memory coherence, the base logic layer of the HMC can be configured to abstract the location of a given memory block into an associated memory word or "cache line." Thus, the memory coherence directory can be stored within the HMC storage vaults. This provides a methodology to manage both traditional memory traffic and cache coherency traffic using the same HMC protocol; thereby providing uniformity to local memory data access and system memory data access.

Figure 4:
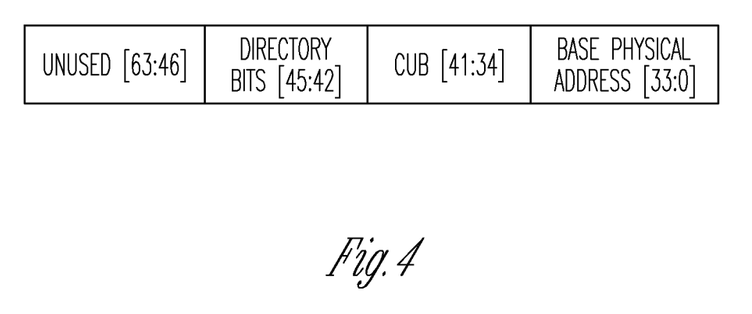
FIG. 4 shows an example of a coherence directory memory format, as may be used to practice some embodiments of the invention.

FIG. 4 shows an example of a coherence directory memory format. The direct memory space of an HMC can be described in terms of physical addresses that are included in the Base Physical Address field. In the example shown, up to 34 bits of physical address storage is available. The base physical address serves as the target for a memory operation and can include the vault, bank, and DRAM address bits. The address extension cube ID (CUB) field indicates the HMC device in which the memory backing the memory word resides. The Directory Bits field provides the memory coherency bits to maintain the state information of the memory word as if the memory word were a cache line. If the memory coherence directory uses the MESI coherence protocol, the Directory Bits include a modified bit, an exclusive bit, a shared bit, and an invalid bit. Accessing the data word as a cache line is performed by accessing the memory word associated with the base physical address plus the CUB offset. If a data entry includes eight bytes, a single 8 GB HMC device can support over one billion concurrent directory entries.

With memory coherency organized in this fashion, lookup and modification operations can be performed on the memory using the HMC atomic memory operations. Directory mutability is maintained while using transaction protocols native to HMC to interact with the directory. This makes the types of memory accesses more uniform.

Access to the directory entries can be performed using an atomic request. Atomic requests involve reading 16 bytes of data from DRAM (as accessed by the request address field), performing an operation on the data through the use of a 16-byte operand (also included in request packet), and then writing the results back to the same location in DRAM. The read-update-write sequence occurs atomically, meaning that no other request can access the same bank until the write of the atomic request is complete. Atomic requests are similar to a 16-byte write request in that they have a 16-byte data payload in the request packet, and a write response may or may not be returned (dependent on whether the requested is a posted or non-posted request). The data resulting from the atomic operation is not returned in a response command. Modifications to the directory entries can be performed using atomic memory operations, such as an ADD immediate request command of an HMC protocol for example. Lookups to the directory entries can be performed using atomic memory operations as well, such as an ADD immediate request command where the target immediate value is zero for example.

Figure 5:
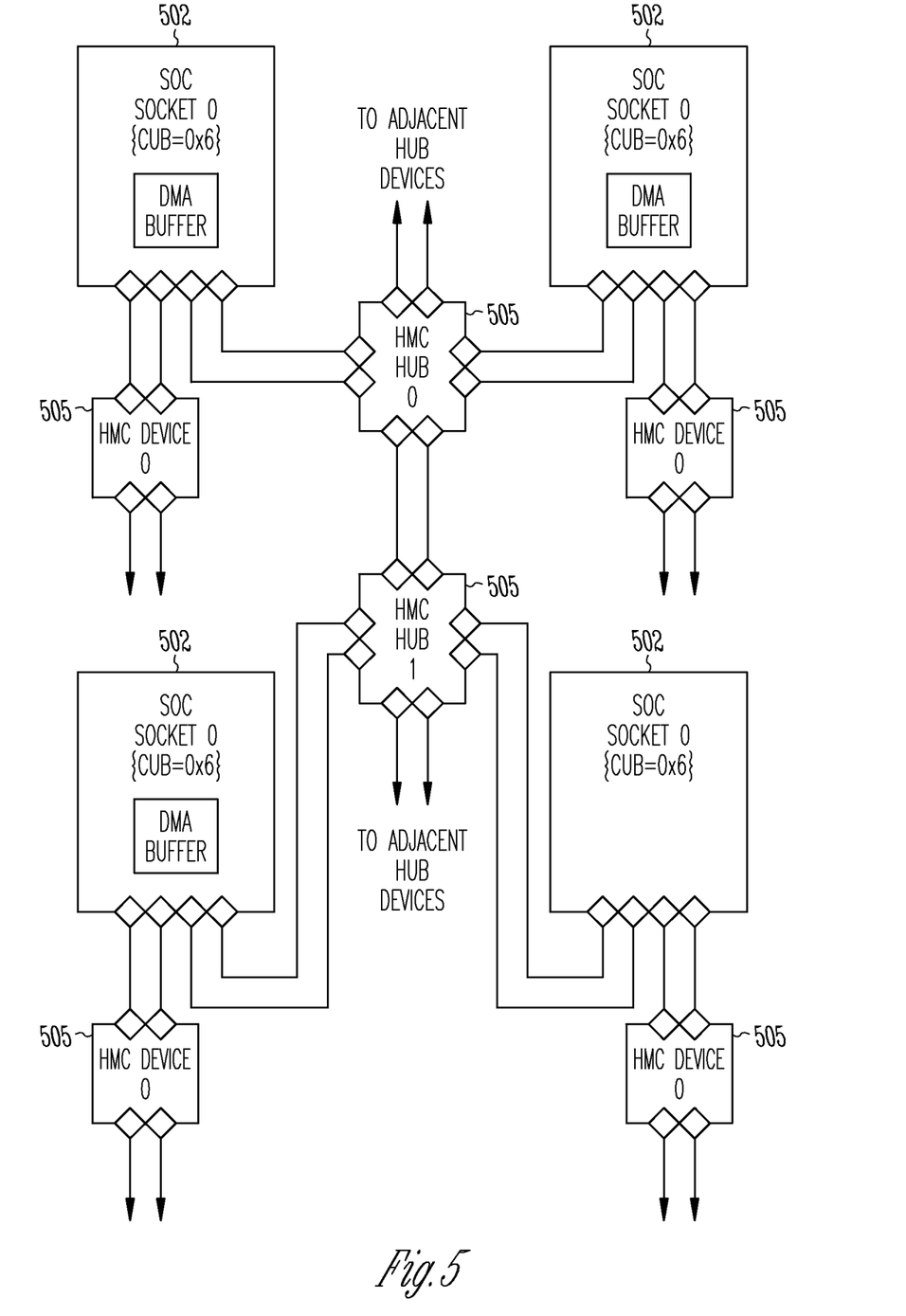
FIG. 5 shows a block diagram of an example of a computer system implemented with HMC devices, as may be used to practice some embodiments of the invention.

FIG. 5 shows a block diagram of an example of a computer system 500 implemented with HMC devices to include an HMC-based memory coherence directory. The system includes a plurality of host processors. The processors can be implemented as SoCs with each processor denoted by an SoC Socket 502. The example shows four processors but the system is flexible to include other numbers of processors.

The system also includes a plurality of HMC devices configured as a distributed shared memory for the host processors. Some of the HMC devices are used as endpoint devices and some HMC devices are used as hub devices. The hub devices may provide pass through communication capability to provide intra-system communication.

Given that the memory is implemented with HMC devices having memory die arranged three-dimensionally, the shared memory is configured for 3D memory access. At least a portion of the memory of the of the memory die of an HMC device 505 is mapped to include at least a portion of a memory coherence directory. This implies that conventional cache coherence data or metadata is stored in memory where the memory word resides. A logic base die of an HMC device includes at least one memory controller that manages three-dimensional (3D) access to HMC device memory by at least one second device, such as a processor or another HMC device for example. The logic base die also includes logic circuitry that implements a memory coherence protocol for data stored in the memory of the plurality of memory die.

Because the coherence directory is stored in the HMC devices, an HMC device itself can serve as the home node for its own data. Memory coherence state information can be stored with the data. The logic base layer allows memory coherence state information to be communicated among the processors without storing the data in a separate cache. Data stored is the shared memory is essentially a cache line. Additionally, given that the memory coherence is implemented by the HMC devices, the processing overhead associated with maintaining memory coherence state information is removed from the processors.

As explained previously, for a multi-host multi-HMC system, I/O communication between host devices and HMC devices is performed using a packetized protocol. The memory coherence protocol can be included in this I/O protocol. The packetized information can include memory coherence state information. In some examples, the memory coherence state information can be included with address information as in the example of FIG. 4. Including the memory coherence protocol with the I/O protocol combines both functions into a unified efficient communication system. This minimizes latency in both local memory requests and system memory requests and eliminates protocol translations between local and system interfaces.

The state information determines whether a processor can safely write data to the memory word, whether the memory word currently holds valid data, and determines how the memory word can be transitioned into a state where reads or writes to the memory word are possible. In some examples, the logic circuitry of an HMC device implements an MSI cache coherence protocol and determines "modified" state information, "shared" state information, and "invalid" state information for a word of memory of the memory die and stores the state information in association with the word of memory of the memory die. In certain variations, the modified state information, shared state information, and invalid state information includes a modified bit, a shared bit, and an invalid bit, respectively. In certain examples, the logic circuitry of an HMC device implements an MESI cache that determines exclusivity state information. In certain examples, the logic circuitry of an HMC device implements an MOSI cache that determines ownership state information for a word of memory of the memory die. The logic circuitry stores one or both of exclusivity state information and ownership state in association with the word of shared memory data. In some examples, the hub HMC device adds routing information to a packetized message. The routing information can be used to (e.g., by a receiving HMC device) to determine memory coherence state information.

According to some examples, a "check-out/check-in" mechanism is used by processors wishing to update a particular memory word. In this case, the processor requests exclusive access to memory location X. Once that access is granted by the HMC device where the memory word resides, the memory word can be marked as "checked out" (either in a small associative table on the device or as an extra bit of state in memory). When data is checked back in by the processor, the HMC device presumes the data is updated. Thus the memory word itself will be written back by the processor (or "flushed") and the space in memory can be reused to store additional state information (e.g., state information indicating the device that checked out the memory word). Further requests for memory word X can receive a response from the HMC device combining both pieces of information (e.g., state information that the cache line is checked out by processor P). The directory-based coherence protocol then proceeds by using memory coherence state updates (e.g., processor P can be asked to flush the memory contents, etc.). When the processor P flushes the new data back to the home node (the HMC device of the memory word), the memory word can be checked in and the state information cleared.

In some examples, the HMC device responds to a specific state request for a target memory word. For instance, the target HMC device may receive a request from a processor for exclusive access to a memory word (e.g., a request for an exclusive state). The logic circuitry of the HMC device may initiate a read of the state information for the memory word. If the state information indicates that a second device already has exclusive access and ownership of the memory word, the logic circuitry may invalidate the memory word and wait for confirmation of the invalidation from the owning device. When confirmation is received, the HMC device may give exclusive access to the original requesting device.

Figure 6:
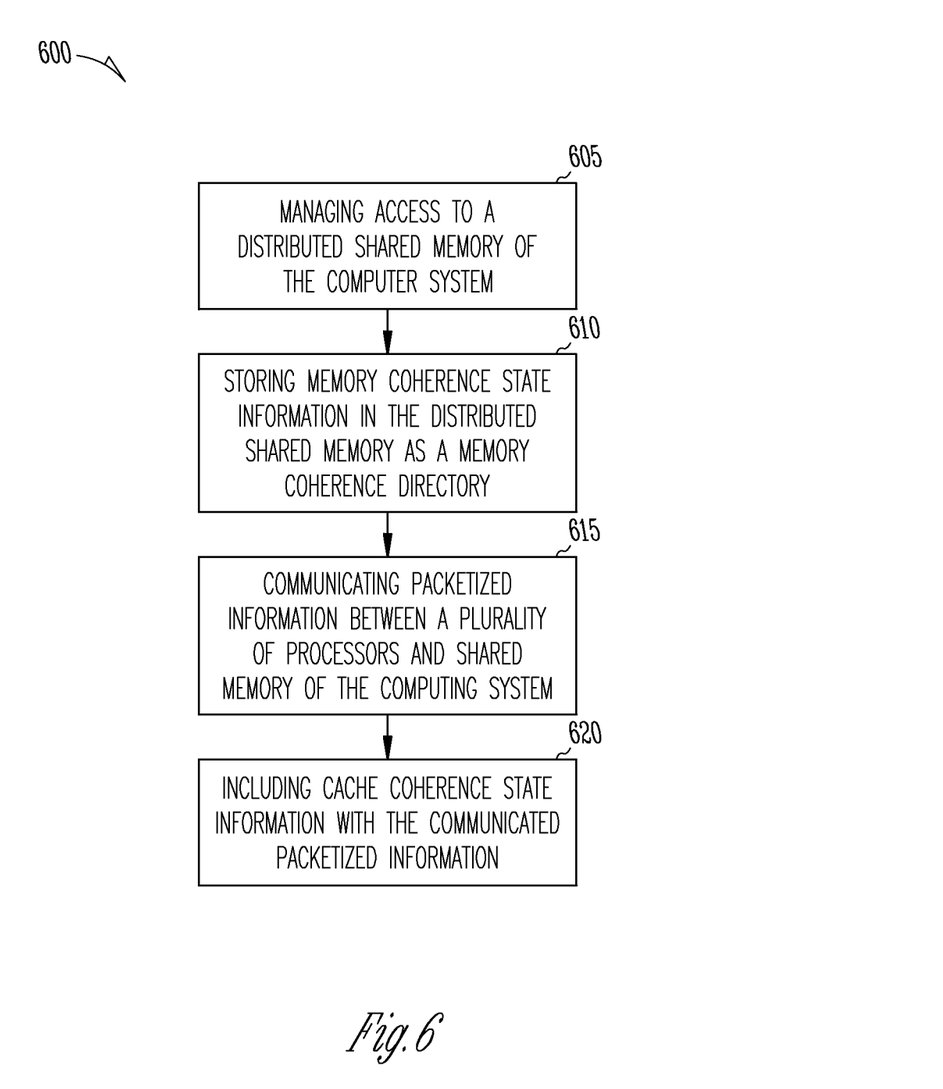
FIG. 6 shows a flow diagram of a method of operating a computer system.

FIG. 6 shows a flow diagram of a method 600 of operating a computer system, such as the example system shown in FIG. 5. At 605, access to a distributed shared memory of the computer system is managed, such as by an HMC protocol for example. The shared memory is configured for three-dimensional access, and includes one or more HMC devices.

At 610, memory coherence state information is stored in the distributed shared memory as a memory coherence directory. In some examples, the memory coherence directory is distributed over multiple HMC devices of the computer system.

At 615, packetized information is communicated between a plurality of processors and the shared memory of the computing system, and at 620 memory coherence state information is included with the communicated packetized information. In some examples, the 620 memory coherence state information is communicated point to point between processors of the computer system.

The example systems and methods described herein provide several advantages over a conventional multi-processor distributed shared memory system. The high bandwidth provided by the HMC devices results in a high bandwidth memory and high bandwidth system interconnect. The distribution of the HMC devices in the system architecture balances the bandwidth and the system latency characteristics between local memories and between other system level memories interconnected with HMC devices. Incorporating the memory coherence protocol into the system I/O protocol provides one uniform protocol that maintains atomicity of memory requests between local memories and system level memories. The uniform protocol minimizes latency by reducing or eliminating protocol translations between local memory access and system-level memory access, and by using an efficient HMC packet specification for both local memory access and system-level memory access. SoC design is simplified by offloading maintenance of the memory coherence directory and by simplifying coherence directory lookups by the SoC.

Although specific embodiments have been illustrated and described herein, it will be appreciated by those of ordinary skill in the art that any arrangement that achieve the same purpose, structure, or function may be substituted for the specific embodiments shown. This application is intended to cover any adaptations or variations of the example embodiments of the invention described herein. It is intended that this invention be limited only by the claims, and the full scope of equivalents thereof.

The invention claimed is:

1. A computing system comprising:
   a plurality of host processors; and
   a plurality of stacked memory devices configured as a distributed shared memory for the host processors, wherein input/output (I/O) information is communicated among the plurality of host processors and the plurality of stacked memory devices using a packetized I/O protocol, each stacked memory device including:
      a plurality of integrated circuit memory dies including at least a first memory die arranged on top of a second memory die, wherein memory coherence information is stored with the data in the distributed shared memory; and
      a logic base die excluding the plurality of host processors and including at least one memory controller configured to manage access to memory of the plurality of memory dies by at least one separate device, and logic circuitry configured to:
         determine memory coherence state information for data stored in the distributed shared memory and store the memory coherence state information with the data in the distributed shared memory,
         manage communication of memory coherence state information between the host processors and the distributed shared memory using a memory coherence protocol included in the packetized I/O protocol, wherein the memory coherence protocol includes a check-out/check-in mechanism to access the memory coherence state information stored in the shared memory, and
         grant access to the stored memory coherence state information by remapping an address of a memory word received according to the check-out/check-in mechanism using an address extension received using the packetized I/O protocol.

2. The system of claim 1, wherein memory of the memory die is mapped as shared memory for a computing system and the logic circuitry of each stacked memory device is configured to implement the memory coherence protocol as part of the packetized I/O protocol using atomic memory operations.

3. The system of claim 1, wherein the logic circuitry of each stacked memory device is configured to communicate packetized information as part of the packetized I/O protocol used to access the memory dies and include memory coherence state information with the packetized information.

4. The system of claim 1, wherein the logic circuitry of each stacked memory device is configured to communicate address information as part of the packetized information and to include memory coherence state information with the address information.

5. The system of claim 1, wherein the logic circuitry of each stacked memory device is configured to determine modified state information, shared state information, and invalid state information for a word of memory of the memory die and store the state information in association with the word of memory of the memory die.

6. The system of claim 1, wherein the logic circuitry of each stacked memory device is configured to determine at least one of exclusivity state information and ownership state information for a word of memory of the memory die and store the state information in association with the word of shared memory data.

7. The system of claim 1, including at least one stacked memory device configured as a hub stacked memory device, wherein logic circuitry of the hub stacked memory device adds routing information to a packetized message and the logic circuitry of a receiving stacked memory device uses the routing information to determine memory coherence state information.

8. The system of claim 1, wherein the logic circuitry of each stacked memory device is configured to, upon receiving a request for exclusive access to a memory word, initiate a request packet from the stacked memory device to a processor with ownership of the memory word.

9. The system of claim 1, wherein the memory controller of the logic base die of each stacked memory is configured to manage 3D access to memory of the memory die by at least one processor and by another stacked memory device.

10. The system of claim 1, wherein the memory die of each stacked memory device include memory arranged as a plurality of vaults and the logic base die includes a memory controller for each vault of the memory die.

11. The system of claim 1, wherein the processors of the plurality of host processors are system-on-chip (SoC) processors.

12. A stacked memory device including:
a plurality of integrated circuit memory dies configured as a system shared memory and including at least a first memory die arranged on top of a second memory die; and
wherein the system shared memory includes a logic base die, the logic base die excluding a system processor and including at least one memory controller configured to manage access to memory of the plurality of memory dies as part of a distributed shared memory by a plurality of host processors and at least one other stacked memory device, and logic circuitry configured to:
determine the memory coherence state information for data and store the memory coherence state information with the data in the plurality of memory dies of the distributed shared memory,
manage communication of information between the host processors and the at least one other stacked memory device using a packetized input/output (I/O) protocol that includes a memory coherence protocol, wherein the memory coherence protocol includes a check-out/check-in mechanism to access the memory coherence state information in the plurality of memory dies, and
grant access to the stored memory coherence state information by remapping an address of a memory word received according to the check-in/check-out mechanism using an address extension received using the packetized I/O protocol.

13. The stacked memory device of claim 12, wherein the logic circuitry of the logic base die is configured to manage the communication of information using atomic memory operations and implement the memory coherence protocol using the atomic memory operations.

14. The stacked memory device of claim 12, wherein the logic circuitry of the logic base die is configured to communicate address information as part of the I/O protocol and include the memory coherence state information with the address information.

15. The stacked memory device of claim 12, wherein the logic circuitry of the logic base die is configured to determine modified state information, shared state information, and invalid state information for a word of memory of the memory die and store the state information in association with the word of memory of the memory die.

16. The stacked memory device of claim 12, wherein the logic circuitry of the logic base die is configured to determine at least one of exclusivity state information and ownership state information for a word of memory of the memory die and store the state information is association with the word of shared memory data.

17. The stacked memory device of claim 12, wherein the memory controller of the logic base die is configured to manage 3D access by the plurality of host processors and the at least one other stacked memory device.

18. The stacked memory device of claim 12, wherein the plurality of memory dies include memory arranged as a plurality of vaults and the logic base die includes a memory controller for each vault of the memory die.

19. A method of operating a computer system that includes a distributed shared memory and a plurality of processors, the method comprising:
managing access to the distributed shared memory of the computer system, wherein the distributed shared memory includes a plurality of stacked memory devices configured for three dimensional access and excludes the processors of the computer system;
storing memory coherence state information in the distributed shared memory as a memory coherence directory, wherein memory coherence information is determined by logic circuitry of the stacked memory devices of the distributed shared memory and stored with data in the distributed shared memory;
communicating packetized information between the plurality of processors and the distributed shared memory of the computing system using an input/output (I/O) protocol that includes a memory coherence protocol; and
including the memory coherence state information with the communicated packetized information in the I/O protocol and using the I/O protocol to access data and the memory coherence information in the distributed shared memory, wherein the I/O protocol includes a check-out/check-in mechanism to access the memory coherence state information stored in the shared memory by the shared memory remapping an address of a memory word received according to the check-out/check-in mechanism using an address extension received using the packetized I/O protocol.

20. The method of claim 19, wherein including memory coherence state information with the communicated packetized information includes incorporating the memory coherence state information into an address field of the packetized information.

21. The method of claim 19, including implementing a memory coherence protocol using the communicated packetized information, wherein memory coherence state information of the memory coherence directory is modified by the shared memory using the memory coherence protocol.

22. The method of claim 19, wherein storing memory coherence state information in the shared memory includes storing the memory coherence state information with a shared memory data word.

23. The method of claim 19, wherein storing memory coherence state information in the shared memory includes storing a modified bit, a shared hit, and an invalid bit with the shared memory data word.

24. The method of claim 19, wherein storing memory coherence state information in the shared memory includes storing at least one of exclusivity information and ownership information with the shared memory data word.

25. The method of claim 19, including modifying the memory coherence state information using a logic base layer that includes at least one memory controller for the shared memory.

26. The method of claim 19, including modifying the memory coherence state information using an atomic memory operation.

27. The method of claim 19, including requesting, by a processor of the plurality of processors, a specific state of a memory word of a target stacked memory device; and initiating a response from the target stacked memory device to one or more processors of the plurality of processors.

\* \* \* \* \*